United States Patent
Hsiao

(10) Patent No.: US 8,194,896 B2
(45) Date of Patent: Jun. 5, 2012

(54) PACKAGING STRUCTURE AND METHOD OF A MEMS MICROPHONE

(75) Inventor: Wei-Min Hsiao, Kao-Hsiung (TW)

(73) Assignee: Advanced Semiconductor Engineering, Inc., Nantze Export Processing Zone, Kao-Hsiung (TW)

( * ) Notice: Subject to any disclaimer, the term of this patent is extended or adjusted under 35 U.S.C. 154(b) by 1185 days.

(21) Appl. No.: 11/970,527

(22) Filed: Jan. 8, 2008

(65) Prior Publication Data

US 2008/0166000 A1 Jul. 10, 2008

(30) Foreign Application Priority Data

Jan. 10, 2007 (TW) .............................. 96101009 A

(51) Int. Cl.
*H04R 25/00* (2006.01)
*H01L 29/84* (2006.01)
*H01L 21/00* (2006.01)

(52) U.S. Cl. ................. 381/175; 257/416; 257/E29.324; 257/E21.499; 438/50

(58) Field of Classification Search .................. 257/252, 257/254, 414–420, E29.324, E21.499; 381/91, 381/170–181, 189, 191, 360–365; 438/48, 438/50, 51, 52, 53
See application file for complete search history.

(56) References Cited

U.S. PATENT DOCUMENTS

| 4,482,915 A * | 11/1984 | Nishikawa et al. ........... 257/669 |
| 2007/0222496 A1* | 9/2007 | Roesch et al. ................. 327/516 |
| 2007/0273022 A1* | 11/2007 | Ozeki et al. .................... 257/701 |
| 2008/0219482 A1* | 9/2008 | Sato .............................. 381/174 |

* cited by examiner

*Primary Examiner* — Ha Tran T Nguyen
*Assistant Examiner* — Kevin Quinto
(74) *Attorney, Agent, or Firm* — Winston Hsu; Scott Margo

(57) ABSTRACT

A package structure of MEMS microphone includes a carrier, a molding compound, a microphone chip and a lid. The carrier has an upper surface on which a chip region is defined, a lower surface and at least one guiding hole communicating with the upper surface and the lower surface. The molding compound has a ring wall portion surrounding the chip region and a filling portion filling the guiding hole. The microphone chip sited on the chip region of the carrier electrically connects the carrier. The lid is jointed to the ring wall portion of the molding compound. In this invention, the guiding hole is used to enable the ring wall portion and the filling portion of the molding compound to be formed integrally, so as to enhance the stability of the molding process and strengthen the structure of the carrier.

18 Claims, 6 Drawing Sheets

PACKAGING STRUCTURE AND METHOD OF A MEMS MICROPHONE

BACKGROUND OF THE INVENTION

1. Field of the Invention

The present invention relates to a packaging structure. More particularly, the present invention relates to a packaging structure of a MEMS microphone.

2. Description of the Prior Art

As shown in FIG. 1, the conventional package structure of a MEMS 10 mainly uses a metal lid 12 to seal a microphone chip 13 on an electric circuit substrate 11. The periphery of the metal lid 12 forms a ring wall 121 by metal processing. If the microphone chip 13 needs sealing, the ring wall 121 of the metal lid 12 is jointed to the periphery of the electric circuit substrate 11 to seal the microphone chip 13. However, the metal lid 12 is not capable of providing better hermetic effect to the surface wires (not shown) of the electric circuit substrate 11 or the electric elements 14. In addition, an alignment process must be carried out to align the ring wall 121 of the metal lid 12 to the periphery of the electric circuit substrate 11. This will make the process more complicated and increase the cost because the ring wall 121 of the metal lid 12.

SUMMARY OF THE INVENTION

One aspect of the present invention is to provide an MEMS microphone package structure and method of packaging. The package structure of a MEMS microphone includes a carrier, a molding compound, a microphone chip and a lid. The carrier has an upper surface on which a chip region is defined, a lower surface and at least one guiding hole communicating with the upper surface and the lower surface. The molding compound has a ring wall portion surrounding the chip region and a filling portion filling the guiding hole. The microphone chip sited on the chip region of the carrier electrically connects the carrier. The lid is jointed to the ring wall portion of the molding compound. In this invention, the ring wall portion is directly formed by the molding process. The conventional metal process to form the metal seal may be omitted and the ring wall portion is capable of sealing the wires and electrical elements on the carrier. In addition, the alignment of the metal lid and the carrier may also be omitted. The guiding hole is designed to make the ring wall portion and the filling portion integrally formed, so as to enhance the stability of the molding process and strengthen the structure of the carrier.

Another aspect of the present invention is to provide an MEMS microphone package structure including an application-specific integrated circuit (ASIC) chip. The ASIC chip is disposed on the chip region of the upper surface of the carrier and electrically connected to the carrier.

According to one package structure of a MEMS microphone, it includes a carrier, a molding compound, a microphone chip and a lid. The carrier has an upper surface on which a chip region is defined, a lower surface and at least one guiding hole communicating with the upper surface and the lower surface. The molding compound has a ring wall portion surrounding the chip region and a filling portion filling the guiding hole. The microphone chip sited on the chip region of the carrier electrically connects the carrier. The lid is jointed to the ring wall portion of the molding compound.

According to one method for packaging a MEMS microphone of the present invention, the method includes providing a carrier with an upper surface on which a chip region is defined, a lower surface and at least one guiding hole for communicating with the upper surface; forming a molding compound on the upper surface of the carrier and the guiding hole, the molding compound having a ring wall portion surrounding the chip region of the carrier and a filling portion filling the guiding hole; depositing a microphone chip on the chip region of the carrier and electrically connected to the carrier; and jointing a lid to the ring wall portion of the molding compound.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
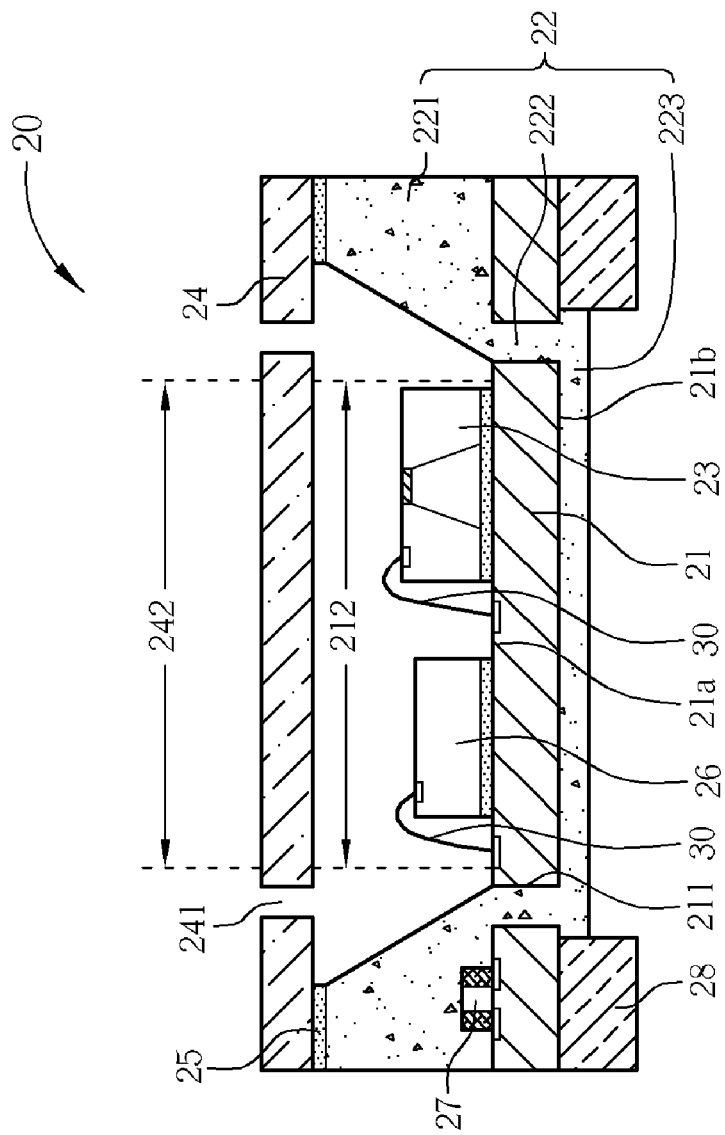
FIG. 2 illustrates a preferred embodiment of the package structure of a MEMS of the present invention.
Figure 3A:
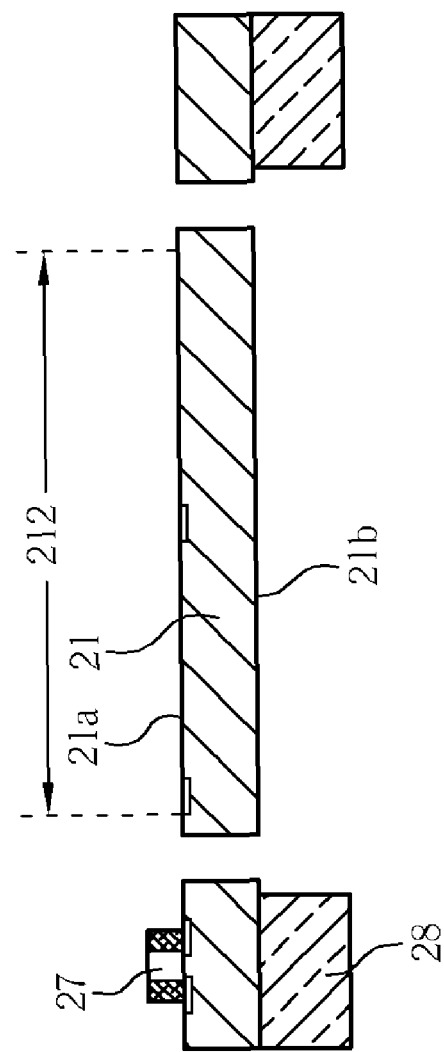
FIGS. 3A to 3D illustrate the method for packaging a MEMS microphone of the present invention.
Figure 3B:
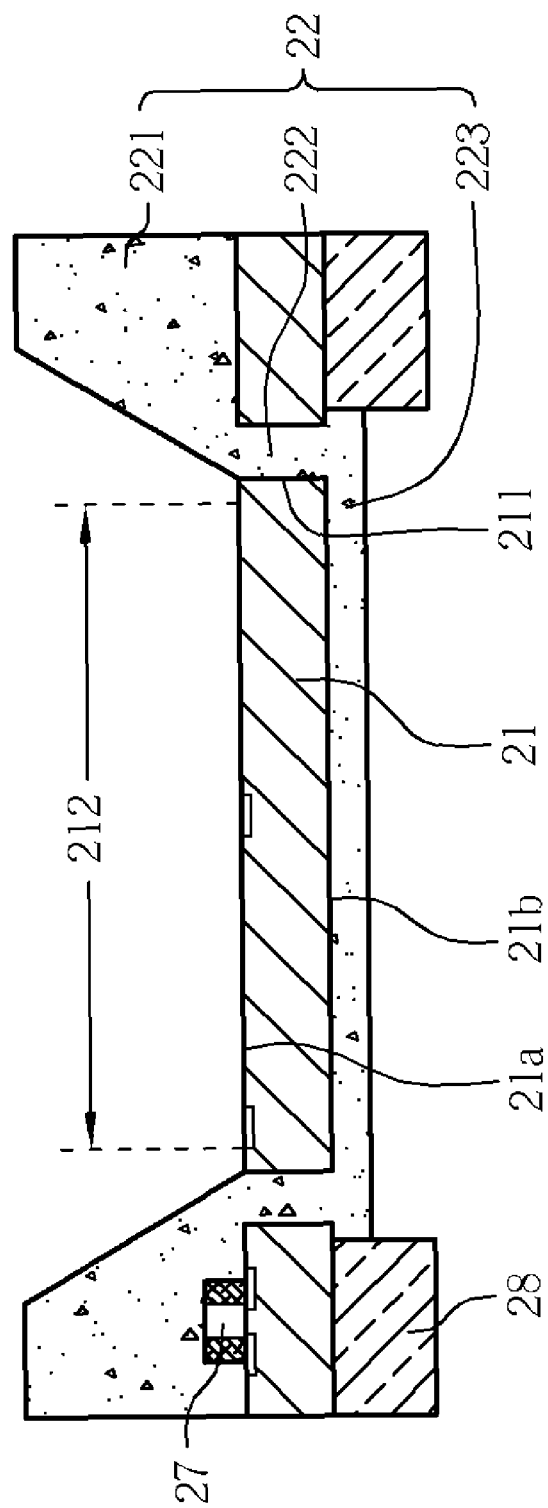
Figure 3C:
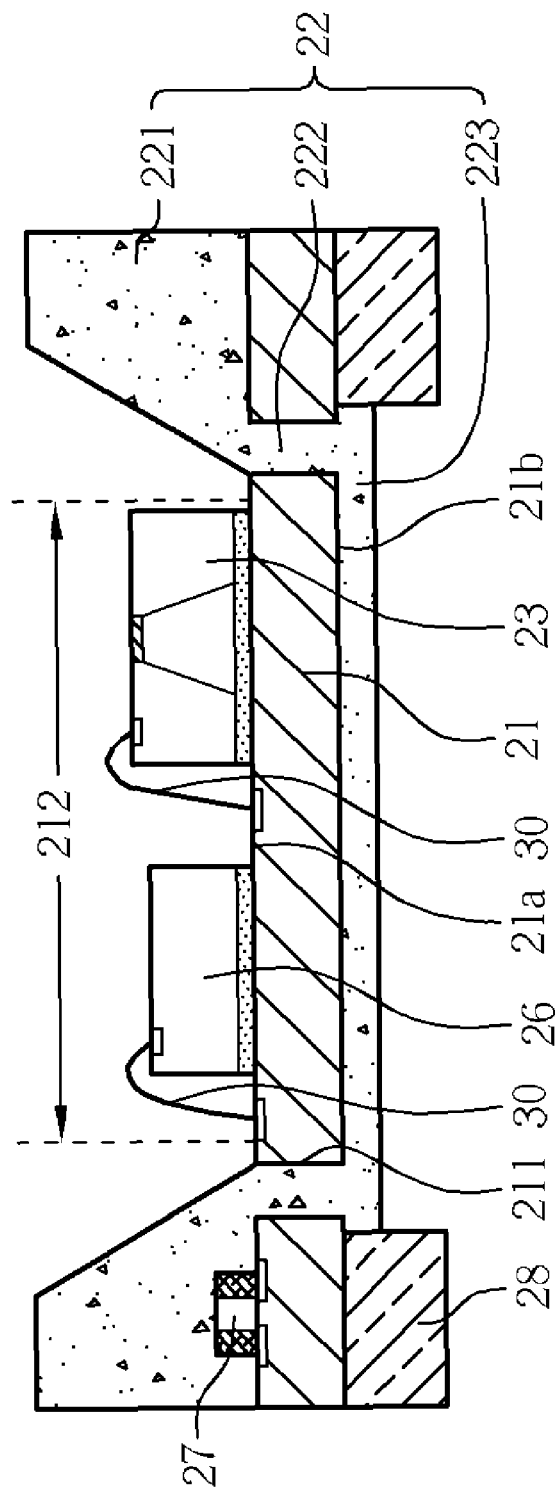
Figure 3D:
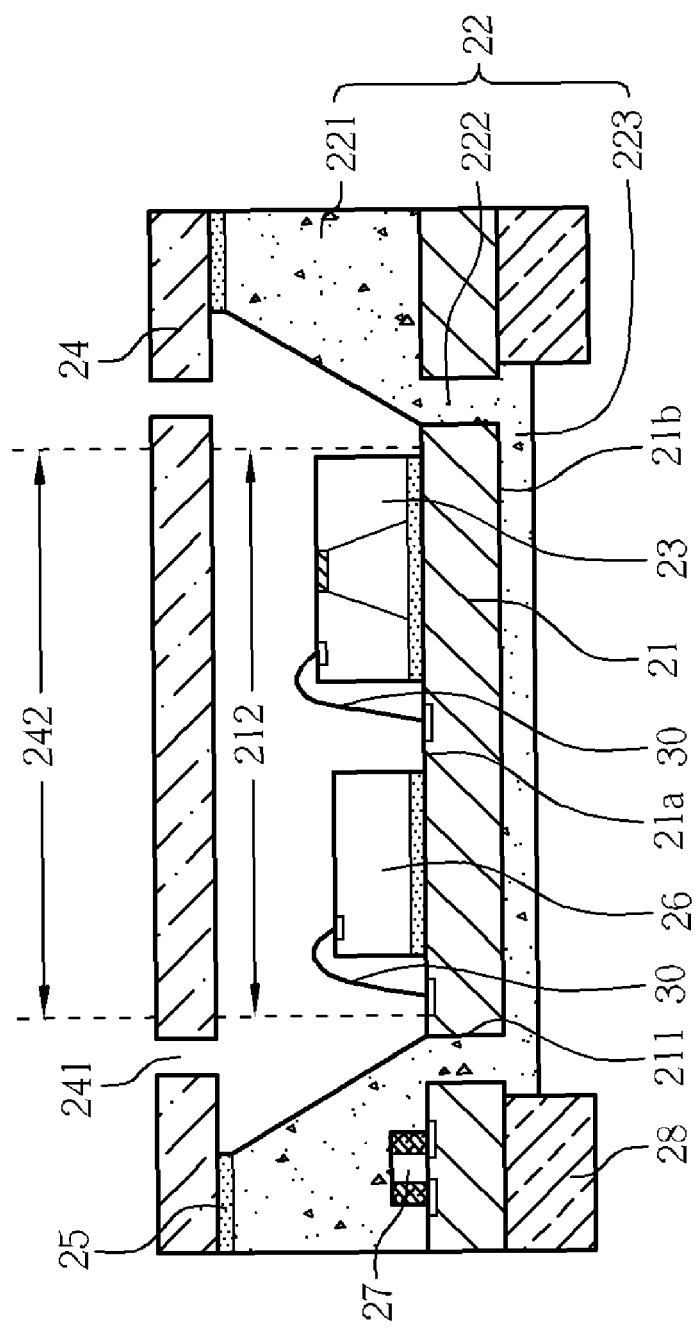

Please refer to FIG. 2, illustrating a preferred embodiment of the present invention. A package structure 20 of MEMS microphone includes a carrier 21, a molding compound 22, a microphone chip 23 and a lid 24. The carrier 21 has an upper surface 21a, a lower surface 21b and at least one guiding hole 211. The guiding hole 211 communicates with the upper surface 21a and the lower surface 21b. The upper surface 21a defines a chip region 212. In this embodiment, the molding compound 22 has a ring wall portion 221, a filling portion 222 and an enhancing portion 223. The ring wall portion 221 surrounds the chip region 212 on the upper surface 21a of the carrier 21. The filling portion 222 fills the guiding hole 211. The enhancing portion 223 is formed on the lower surface 21b of the carrier 21. The enhancing portion 223 and the filling portion 222 are integrally formed to enhance the structural strength of the carrier 21. Preferably, the ring wall portion 221, the filling portion 222 and the enhancing portion 223 are integrally formed. The microphone chip 23 is sited on the chip region 212 of the upper surface 21a of the carrier 21 and electrically connected to the carrier 21. In this embodiment, the microphone chip 23 is electrically connected to the carrier 21 by wire bond. The height of the microphone chip 23 is lower than that of the ring wall portion 221 to avoid the wire 30 contacting the lid 24 to cause a short circuit. The lid 24 is jointed to the ring wall portion 221 of the molding compound 22 by means of a glue layer 25. The lid 24 has at least a hole 241 and defines a middle area 242 corresponding to the chip region 212 on the upper surface 21a of the carrier 21. The hole 241 is disposed on the outer periphery of the middle area 242 to avoid dust on the microphone chip 23 in the chip region 212.

Figure 1:
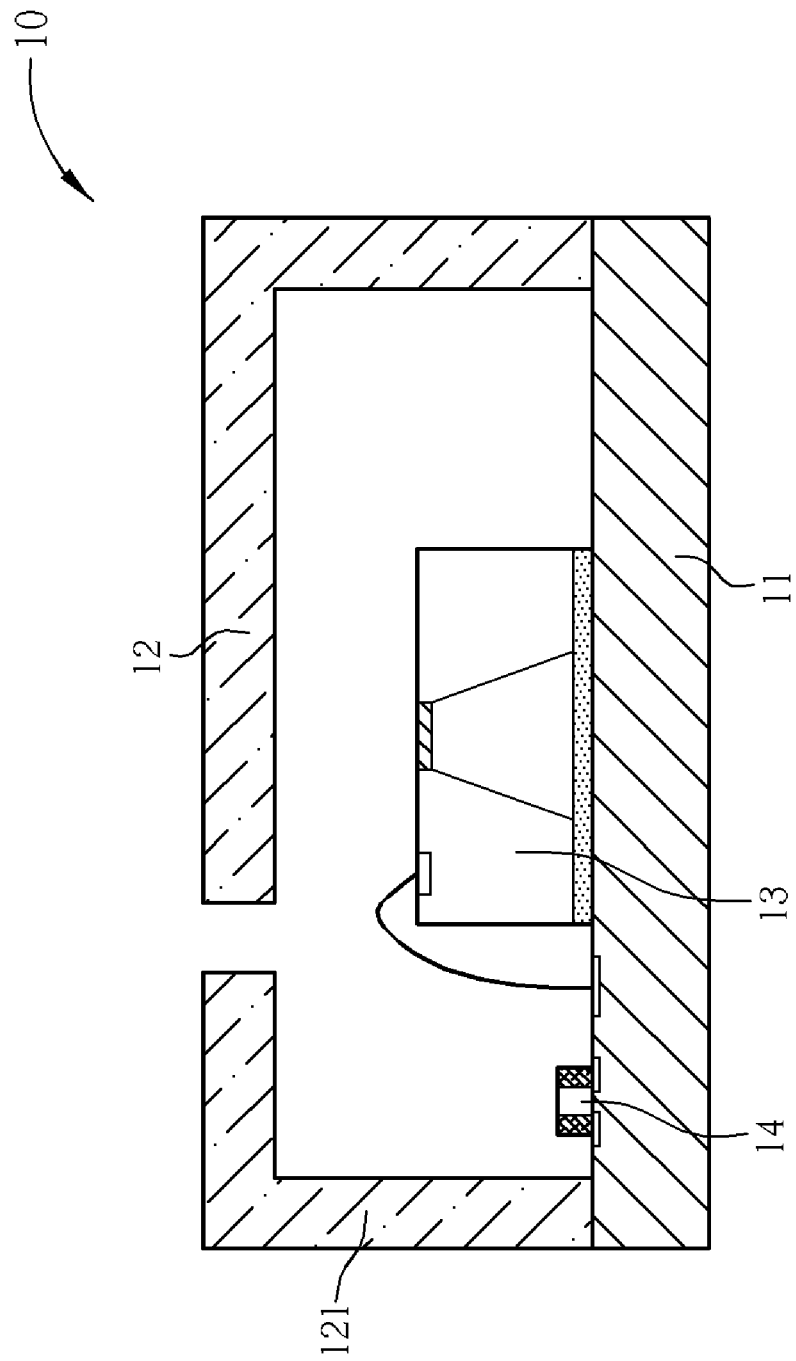
FIG. 1 illustrates a conventional package structure of a MEMS.

Please refer to FIG. 2 again. In this embodiment, the package structure 20 of MEMS microphone further includes an application-specific integrated circuit (ASIC) chip 26 and at least a passive element 27. The ASIC chip 26 is disposed on the chip region 212 on the upper surface 21a of the carrier 21. The ASIC chip 26 is electrically connected to the carrier 21. The passive element 27 is disposed on the upper surface 21a of the carrier 21 and sealed by the ring wall portion 221 of the molding compound 22. In this embodiment, the ASIC chip 26 is an amplifier to transfer and amplify the sound waves from the microphone chip 23 to electrical signals. The height of the application specific IC chip 26 is lower than that of the ring wall portion 221. The application specific IC chip 26 is electrically connected to the carrier 21 by wire bond. Alternatively, in another embodiment, the application specific IC chip 26 is electrically connected to the carrier 21 by flip-chip bond (not shown). Please refer to FIG. 1 again. In this embodiment, there are multiple I/O leads 28 on the lower surface 21b of the carrier 21. The package structure 20 of MEMS microphone may be electrically connected to an external circuit (not shown) through the I/O leads 28, and the enhancing portion 223 of the molding compound 22 may be formed between the I/O leads 28.

The present invention uses the molding compound to directly form the ring wall portion 221. The conventional metal process to form the metal seal may be omitted and the ring wall portion 221 is capable of sealing the wires (not shown) on the upper surface 21a of the carrier 21 and the passive element 27 on the upper surface 21a. In addition, the guiding hole 211 is designed to have the molding compound 22 make the ring wall portion 221, the filling portion 222 and the enhancing portion 223 integrally formed, so as to enhance the stability of the molding process and strengthen the structure of the carrier 21.

Please refer to FIGS. 3A to 3D for the method for packaging a MEMS microphone of the present invention. Please refer to FIG. 3A. A carrier 21 is provided. The carrier 21 has an upper surface 21a, a lower surface 21b and at least one guiding hole 211. The guiding hole 211 communicates with the upper surface 21a and the lower surface 21b. The upper surface 21a defines a chip region 212. In this embodiment, there is at least a passive element 27 on the upper surface 21a of the carrier 21 and there are multiple I/O leads 28 formed on the lower surface 21b of the carrier 21. The package structure 20 of MEMS microphone may be electrically connected to an external circuit (not shown) through the I/O leads 28. Please refer to FIG. 3B, a molding compound 22 is formed on the upper surface 21a of the carrier 21 and in the guiding hole 211. In this embodiment, the molding compound 22 may be formed on the lower surface 21b of the carrier 21. The molding compound 22 has a ring wall portion 221, a filling portion 222 and an enhancing portion 223. The ring wall portion 221 surrounds the chip region 212 on the upper surface 21a of the carrier 21 and seals the passive element 27. The filling portion 222 fills the guiding hole 211. The enhancing portion 223 is formed on the lower surface 21b of the carrier 21. The enhancing portion 223 and the filling portion 222 are integrally formed. Preferably, the ring wall portion 221, the filling portion 222 and the enhancing portion 223 are integrally formed. Please refer to FIG. 3C. A microphone chip 23 and an ASIC chip 26 are disposed on the chip region 211 of the upper surface 21a of the carrier 21 and electrically connected to the carrier 21 by wire bond. The ASIC chip 26 may also be electrically connected to the carrier 21 by flip-chip bond (not shown). Please refer to FIG. 3D. A lid 24 is jointed to the ring wall portion 221 of the molding compound 22. The lid 24 has at least a hole 241 and defines a middle area 242 corresponding to the chip region 212 on the upper surface 21a of the carrier 21. The hole 241 is disposed on the outer periphery of the middle area 242 to avoid dust on the microphone chip 23 in the chip region 212. In this embodiment, the lid 24 may be jointed to the ring wall portion 221 of the molding compound 22 by means of a glue layer 25 to enhance the joint.

Those skilled in the art will readily observe that numerous modifications and alterations of the device and method may be made while retaining the teachings of the invention.

What is claimed is:

1. A MEMS microphone package structure, comprising:
   a carrier with an upper surface on which a chip region is defined, a lower surface and at least one guiding hole for connecting said upper surface and said lower surface;
   a molding compound with a ring wall portion surrounding said chip region and a filling portion filling said guiding hole;
   a microphone chip sited on said chip region of said carrier and electrically connected to said carrier; and
   a lid jointed to said ring wall portion of said molding compound, defining a middle region corresponding to said chip region of said upper surface of said carrier and comprising a least one hole disposed outside of said middle region.

2. The MEMS microphone package structure of claim 1, further comprising at least one passive element disposed on said upper surface of said carrier.

3. The MEMS microphone package structure of claim 2, wherein said ring wall portion of said molding compound seals said passive element.

4. The MEMS microphone package structure of claim 1, wherein said ring wall portion and said filling portion of said molding compound are integrally formed.

5. The MEMS microphone package structure of claim 1, wherein said molding compound further comprises an enhancing portion formed on said lower surface of said carrier and said enhancing portion and said filling portion are integrally formed.

6. The MEMS microphone package structure of claim 1, wherein the height of said microphone chip is lower than that of said ring wall portion.

7. The MEMS microphone package structure of claim 1, wherein said microphone chip is electrically connected to said carrier by wire bond.

8. The MEMS microphone package structure of claim 1, further comprising an application specific IC chip disposed on said chip region of said carrier and electrically connected to said carrier.

9. The MEMS microphone package structure of claim 8, wherein said application specific IC chip is electrically connected to said carrier by wire bond.

10. The MEMS microphone package structure of claim 8, wherein said application specific IC chip is electrically connected to said carrier by flip-chip bond.

11. The MEMS microphone package structure of claim 8, wherein the height of said application specific IC chip is lower than that of said ring wall portion.

12. A method for packaging a MEMS microphone, comprising:
    providing a carrier with an upper surface on which a chip region is defined, a lower surface and at least one guiding hole for connecting said upper surface and said lower surface;
    forming a molding compound on said upper surface of said carrier and said guiding hole, said molding compound having a ring wall portion surrounding said chip region of said carrier and a filling portion filling said guiding hole;
    depositing a microphone chip on said chip region of said carrier and said microphone chip electrically connected to said carrier; and
    jointing a lid to said ring wall portion of said molding compound, wherein said lid defines a middle region corresponding to said chip region of said upper surface of said carrier and comprises a least one hole disposed outside of said middle region.

13. The method of claim 12, further comprising depositing at least one passive element on said upper surface of said carrier.

14. The method of claim 13, wherein said ring wall portion of said molding compound seals said passive element.

15. The method of claim 12, wherein said microphone chip is electrically connected to said carrier by wire bond.

16. The method of claim 12, further comprising:
depositing an application specific IC chip on said chip region of said carrier and electrically connected to said carrier.

17. The method of claim 16, wherein said application specific IC chip is electrically connected to said carrier by wire bond.

18. The method of claim 16, wherein said application specific IC chip is electrically connected to said carrier by flip-chip bond.

* * * * *